United States Patent
Okumura

(10) Patent No.: US 6,187,088 B1
(45) Date of Patent: Feb. 13, 2001

(54) LASER IRRADIATION PROCESS

(75) Inventor: Hiroshi Okumura, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/353,358

(22) Filed: Jul. 15, 1999

(30) Foreign Application Priority Data

Aug. 3, 1998 (JP) ................................................. 10-219200

(51) Int. Cl.$^7$ ................................................. C30B 28/02
(52) U.S. Cl. ................................ 117/8; 117/10; 438/487; 438/488
(58) Field of Search ..................... 438/486, 487, 438/488, 166, 795, 378; 117/7, 8, 909, 10

(56) References Cited

U.S. PATENT DOCUMENTS

| | | | |
|---|---|---|---|
| 5,145,808 | * | 9/1992 | Sameshima et al. ................ 437/173 |
| 5,496,768 | * | 3/1996 | Kudo .................................... 437/174 |
| 5,858,822 | * | 1/1999 | Yamazaki et al. .................. 438/166 |
| 6,015,720 | * | 1/2000 | Minegishi et al. .................... 438/30 |

FOREIGN PATENT DOCUMENTS

| | | | | |
|---|---|---|---|---|
| 0655774A2 | * | 5/1995 | (EP) | ................. H01L/21/20 |
| 9-246183 | | 9/1997 | (JP) | . |
| 11274095 | * | 10/1999 | (JP) | ................. H01L/21/20 |

* cited by examiner

*Primary Examiner*—Olik Chaudhuri
*Assistant Examiner*—Ginette Peralta
(74) *Attorney, Agent, or Firm*—Sughrue, Mion, Zinn, Macpeak & Seas, PLLC

(57) ABSTRACT

A pulse laser beam having a rectangular irradiation region is irradiated on the same point in a non-single crystal semiconductor film multiple times. The pulse laser beam has an energy profile in a longitudinal direction in the beam irradiation region as follows: (a) there are the first region having an energy density of Ea or higher and the second regions on both sides of the first region having an energy density of less than Ea, and (b) an energy density slope has an absolute value of 20 to 300 J/cm3 in a boundary region extending to 1 μm from the boundary line between the first and the second regions.

16 Claims, 11 Drawing Sheets

Modulation type of profile formation process

LASER IRRADIATION PROCESS

REFERENCE TO RELATED APPLICATION AND INCORPORATION BY REFERENCE

This application is based on application NO.HEI10-219200 filed in Japan, the content of which is incorporated hereinto by reference.

BACKGROUND OF THE INVENTION

1. Field of the Invention

This invention relates to a laser irradiation process comprising irradiating a pulse laser beam on a non-single crystal semiconductor film for annealing; in particular it relates to a laser irradiation process for forming a channel layer in a polycrystalline silicon thin film transistor which may be, for example, used for a liquid crystal display or a contact type image sensor.

2. Description of the Related Art

Recently, a thin film transistor comprising a polysilicon film as a channel layer on a glass substrate has been intensely developed for application in, for example, a liquid crystal display or a contact type image sensor. A laser annealing has been a common technique for preparing a polysilicon film in the light of reduction in a process temperature and improvement of a throughput; the process comprises forming a silicon film as a precursor on which an ultraviolet pulse laser beam is then irradiated to cause crystallization via fusion for forming a polycrystalline structure.

A common laser irradiation process is irradiation of a pulse laser beam having a rectangular or linear irradiation region.

JP-A 9-246183 has disclosed a process for irradiating a laser beam having a trapezoidal profile in a linewidth direction, which will be described with reference to FIG. 8. The process comprises irradiating a laser having a trapezoidal profile as shown in the figure only once to provide a polycrystalline structure. The energy density in the center of the trapezoidal beam profile is equal to or higher than a microcrystallization threshold for an amorphous semiconductor (amorphous silicon). There exists a region with a slightly lower energy than the microcrystallization threshold in the slope of the trapezoidal beam profile. It is believed that a polycrystalline semiconductor region with a large grain size can be formed.

This process may form a polycrystalline semiconductor region with a large grain size in a region with a slightly lower energy than the microcrystallization threshold, but the large crystal grains are randomly arranged and generally their size is widely distributed. Thus, when such a polycrystalline semiconductor region is used as, for example, a channel layer for a TFT (Thin Film Transistor), TFT properties such as a mobility may significantly vary.

The above publication has disclosed an irradiation process where a linear laser is scanned in its linewidth direction, i.e., a direction perpendicular to the line direction, which may provide a large area of polycrystalline silicon film. Thus, a variety of processes for irradiating a laser beam with a trapezoidal profile by scanning have been proposed. These processes, however, have a common problem that a crystal structure in a polycrystalline silicon film formed is poorly uniform. For example, Nouda et al, Shingaku Giho Vol. SDM92-112, p. 53 (1992) has disclosed that a beam end of a pulse laser beam may significantly vary the size of a crystal formed by the next irradiation, due to dependency of the state of the melted film by laser irradiation on the film structure before irradiation. In particular, a fused state is considerably changed in an interface between an already-irradiated region (crystallized region) and a non-irradiated region (amorphous region) when an amorphous silicon film is used as a precursor.

FIG. 9 shows a grain size distribution for a polycrystalline silicon structure formed by a laser annealing using a laser beam having a common trapezoidal energy density profile. FIG. 9(b) shows a grain size distribution in a polycrystalline region formed by irradiating a pulse laser having the profile shown in FIG. 9(a) on an amorphous silicon film. Then, a pulse laser beam is irradiated by scanning with a pitch x, so that the grain size distribution may vary as shown in FIG. 9(c). In the figure, a local minimum in a grain size can be observed in a region around the beam end in FIG. 9(b). Finally, a polycrystalline silicon film having a grain size distribution shown in FIG. 9(d) is formed, except the region where irradiation is initiated or stopped. In other words, there occurs unevenness in a grain size due to change in a crystal structure caused by the beam end. The grain size shown in FIG. 9(d) is an average size, and when such a trapezoidal beam profile is used, large crystal grains are randomly arranged, leading to a wide distribution of grain size as described above.

SUMMARY OF THE INVENTION

In the light of the above problems, an objective of this invention is to provide a laser irradiation process for forming a large-size polycrystalline silicon film exhibiting an even grain-size distribution and a good grain arrangement.

This invention provides a laser irradiation process comprising irradiating a pulse laser beam on a non-single crystal semiconductor film to form a polycrystalline semiconductor film, where an energy profile along one direction in a pulse laser beam irradiation region meets the conditions (A) and (B) and comprising irradiating the pulse laser beam on the same position multiple times:

(A) there are the first region having an energy density of $E_a$ or higher and the second regions on both sides of the first region having an energy density of less than $E_a$, where $E_a$ is a microcrystallization energy for an amorphous semiconductor film; and (B) an energy density slope has an absolute value of 20 to 300 $J/cm^3$ in a boundary region in the second region extending to 1 $\mu$m from the boundary line between the first and the second regions.

In the laser irradiation process of this invention, a pulse laser exhibiting a profile having a given energy density slope in a boundary region is irradiated on the same position multiple times. Thus, a polycrystalline silicon film where large grains with an even size distribution are orderly arranged can be formed in the vicinity of the boundary region. Such a polycrystalline semiconductor film may be used to provide a high efficient device.

This invention also provides a laser irradiation process comprising irradiating a pulse laser beam on a non-single crystal semiconductor film to form a polycrystalline semiconductor film, where an energy profile along one direction in a pulse laser beam irradiation region meets the conditions (A) and (B) and comprising irradiating the pulse laser beam on the same position multiple times:

(A) there are alternately the first regions having an energy density of $E_a$ or higher and the second regions having an energy density of less than $E_a$, where $E_a$ is a microcrystallization energy for an amorphous semiconductor film; and (B) an energy density slope has an absolute value of 20 to 300 J/cm³ in a boundary region in the second region extending to 1 μm from the boundary line between the first and the second regions.

This process may provide, in one step, a plurality of polycrystalline semiconductor structures where large grains with an even size are orderly arranged, for improving a process efficiency.

In the above laser irradiation process, an energy profile in a direction perpendicular to the above direction may meet the following conditions (A) and (B):

(A) there are the first region having an energy density of $E_a$ or higher and the second regions on both sides of the first region having an energy density of less than $E_a$, where $E_a$ is a microcrystallization energy for an amorphous semiconductor film; and (B) an energy density slope has an absolute value of 20 to 300 J/cm³ in a boundary region in the second region extending to 1 μm from the boundary line between he first and the second regions.

In the above laser irradiation process, an energy profile in a direction perpendicular to the above direction may meet the following conditions (A) and (B):

(A) there are alternately the first regions having an energy density of $E_a$ or higher and the second regions having an energy density of less than $E_a$, where $E_a$ is a microcrystallization energy for an amorphous semiconductor film; and (B) an energy density slope has an absolute value of 20 to 300 J/cm³ in a boundary region in the second region extending to 1 μm from the boundary line between the first and the second regions.

The widths of the first and the second regions may be appropriately determined, depending on the size and the layout of a device to be fabricated; preferably at least 1 μm. If they are less than 1 μm, it is sometimes difficult to satisfactorily provide a polycrystalline semiconductor structure in which a grain size is about 1 μm. There are no limitations for their upper limit, but generally below 100 μm.

As described above, in a laser irradiation process of this invention, a pulse laser exhibiting a profile having a given energy density slope in a boundary region is irradiated on the same position multiple times, to form a polycrystalline silicon film where large grains with an even size distribution are orderly arranged in the vicinity of the boundary region. Such a polycrystalline semiconductor film may be used to provide a high efficient device.

A profile where there are alternately the first regions having an energy density of $E_a$ or higher and the second regions having an energy density of less than $E_a$ may be selected to form, in one step, a plurality of polycrystalline silicon structures, leading to improvement of a process efficiency.

Furthermore, an energy profile whose longitudinal and transverse directions in an irradiation region meet given conditions may be selected to orderly arrang a polycrystalline silicon structure not only in one direction in the region but also in a direction perpendicular to the above direction, for providing a further improved efficiency device.

BRIEF DESCRIPTION OF THE INVENTION

Figure 6:
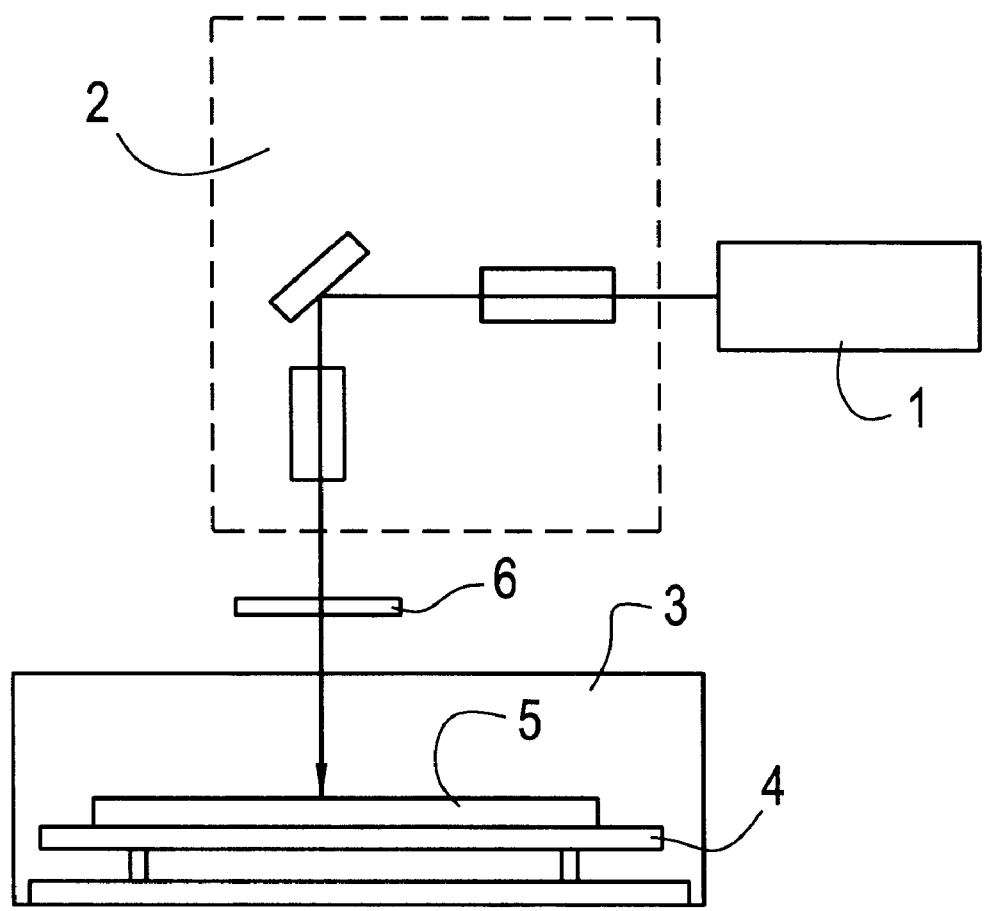

FIG. 6 schematically shows a laser irradiation apparatus for conducting a laser irradiation process of this invention.

FIG. 7 illustrates a process for providing a given beam profile in a laser irradiation process of this invention.

Figure 8:
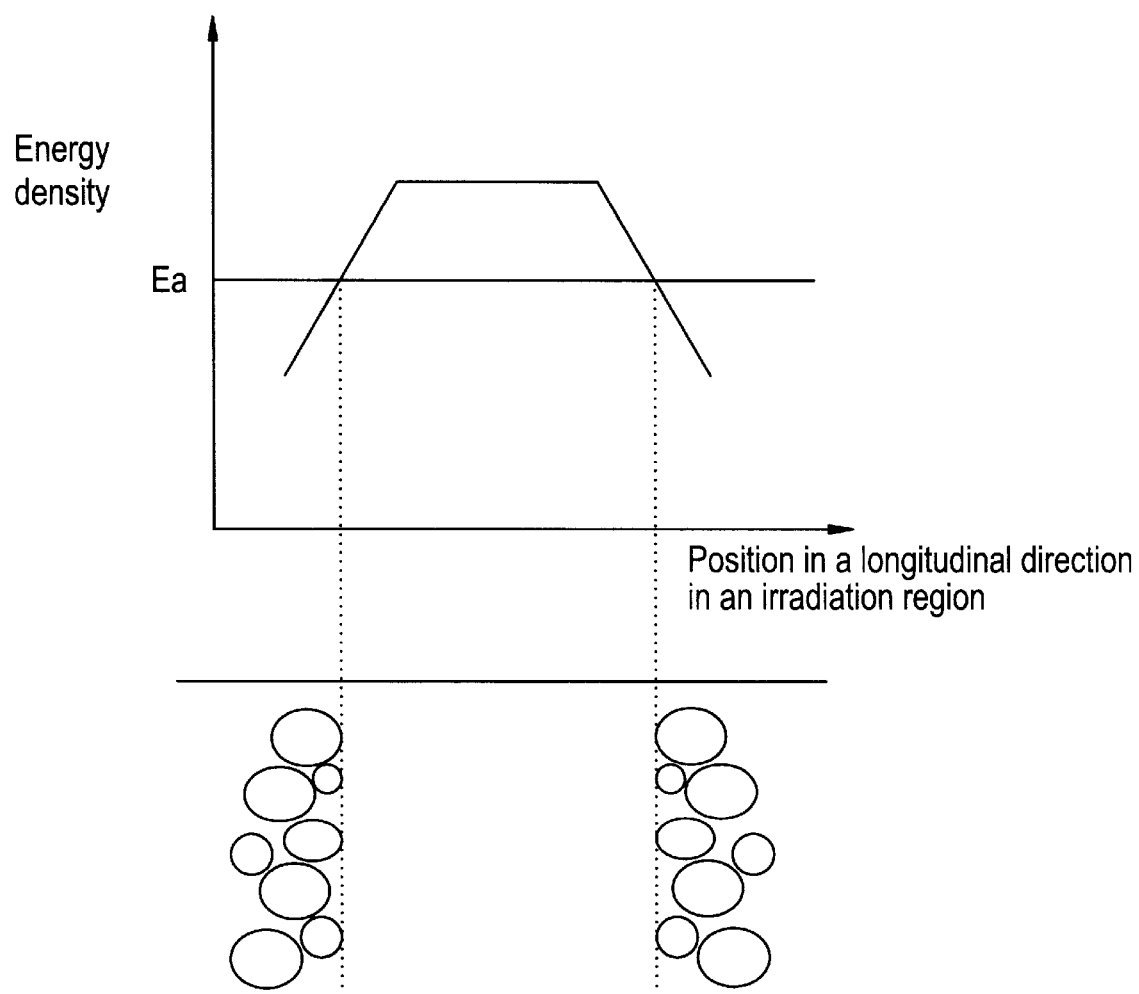
Figure 9A:
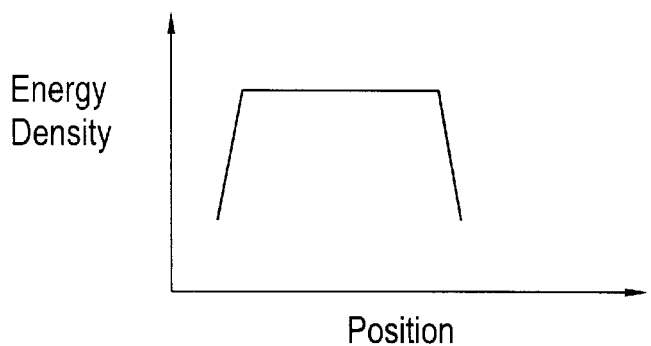
Figure 9B:
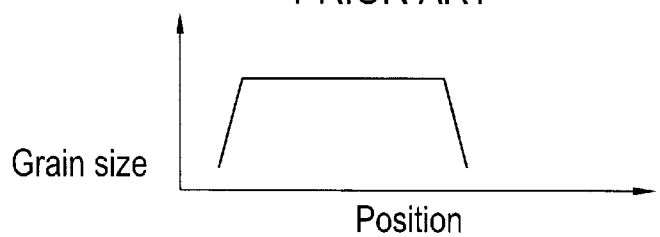
Figure 9C:
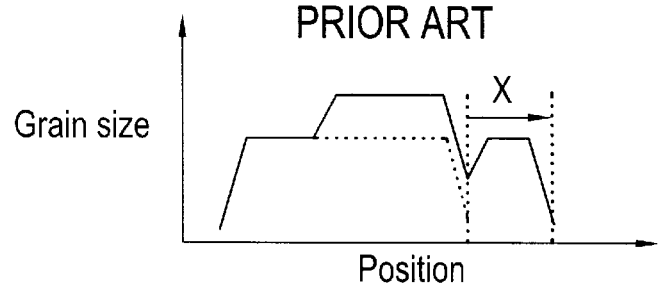
Figure 9D:
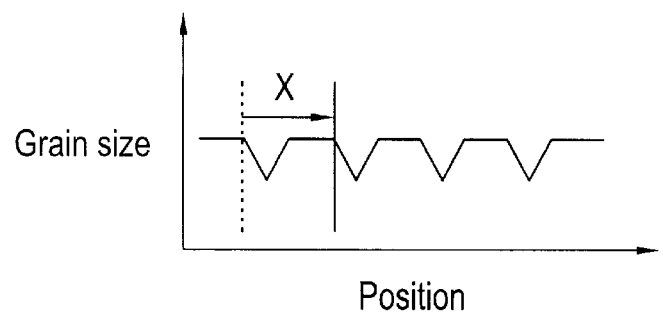

FIG. 8 illustrates a laser irradiation process of the prior art.

FIG. 9 illustrates a laser irradiation process of the prior art.

Figure 10:
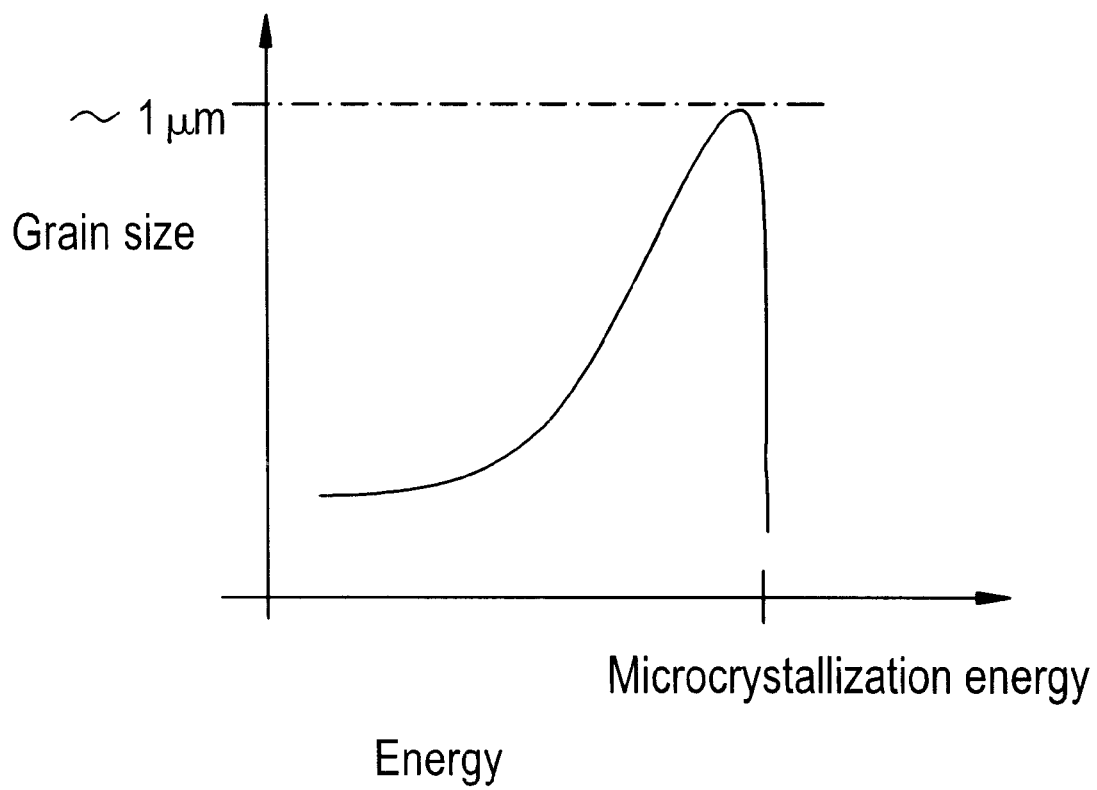

FIG. 10 shows relationship between the energy density of a laser irradiated on amorphous silicon and the grain size of a crystal formed.

Figure 11:
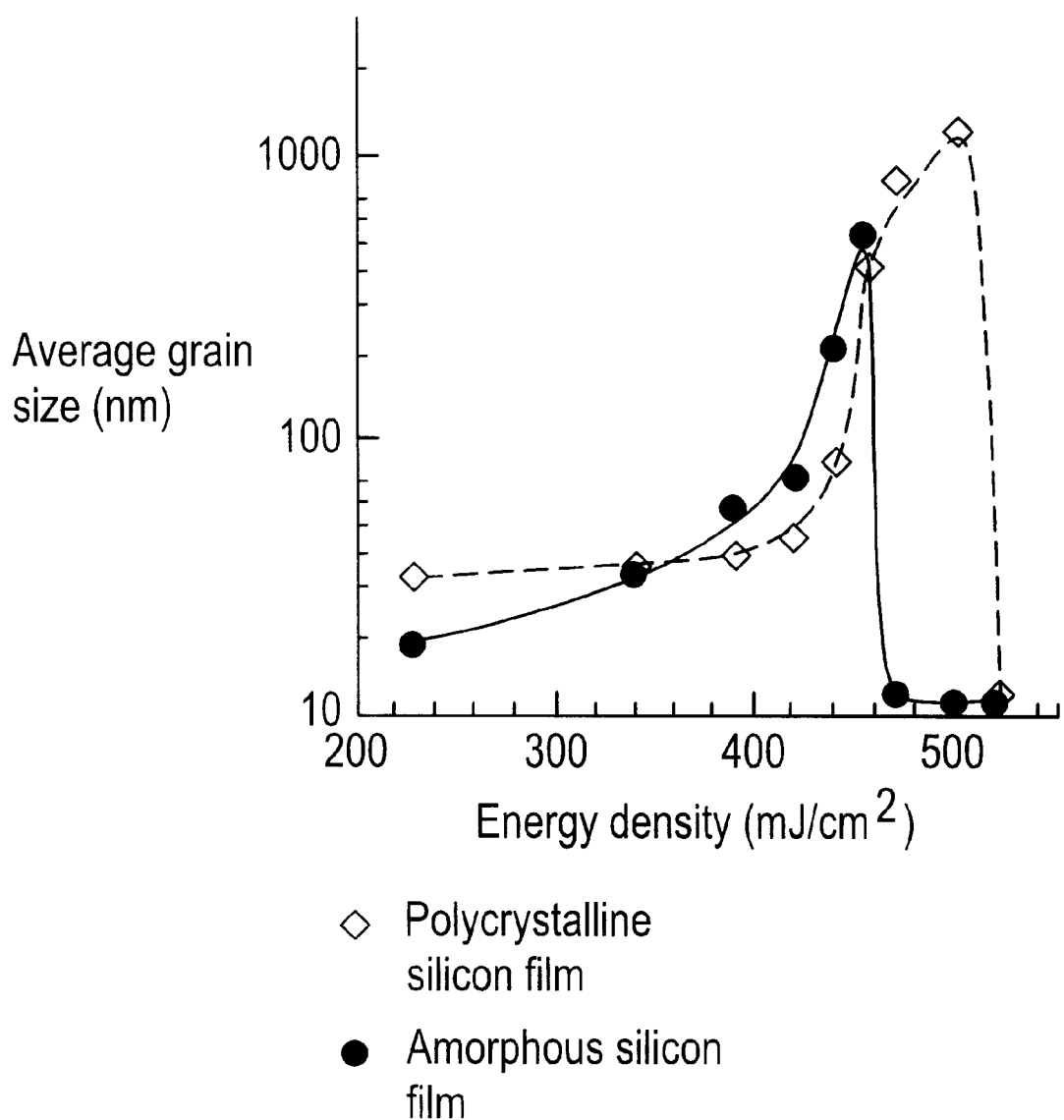

FIG. 11 shows relationship between the energy density of a laser and the grain size of a crystal formed.

DETAILED DESCRIPTION OF THE PREFERRED EMBODIMENTS

In this invention, a pulse laser beam is irradiated on a non-single crystal semiconductor film. There are no limitations for the shape of an irradiation region, but it is preferably rectangular or linear. For a rectangular irradiation region, the ratio of the longitudinal side to the transverse side in the irradiation region may be selected as appropriate. A non-single crystal semiconductor film refers to a semiconductor film which is not a single crystal, including amorphous films such as amorphous silicon and polycrystalline films such as polysilicon.

In this invention, laser irradiation is utilized for forming a polycrystalline semiconductor film comprising crystal grains whose size is preferably at least 0.5 μm, more preferably at least 1 μm. A polycrystalline semiconductor film comprising such large size grains may provide a high efficiency device.

In this invention, a pulse laser beam is irradiated on the same position multiple times. Specifically, a pulse laser beam having a given energy density profile is irradiated on the same position without moving the irradiation position. There are no limitations for the irradiation number, but given improvement in a process efficiency it may be desirably as small as possible. The irradiation number is preferably 2 to 10, more preferably 2, because irradiating a laser twice may be adequate to form a desired polycrystalline silicon film in the irradiation process of this invention.

An "energy density slope" herein refers to the slope of the inclined part in an energy density profile obtained when an abscissa and an ordinate are a position and an energy density distribution in an irradiation region, respectively. An energy density slope is obtained by differentiating an energy density with a variable representing a position. Thus, it may be represented by a unit of J/cm²/cm, i.e., J/cm³.

A microcrystallization energy $E_a$ for an amorphous material in this invention will be described. In laser annealing of amorphous silicon, the grain size of a polycrystalline silicon formed depends on a laser energy density. Specifically, it is known that a grain size increases as an energy density increases, but once the energy density exceeds a particular value, the grain size sharply decreases to below 20 nm (FIG. 10). The particular energy density is referred to as a microcrystallization threshold for an amorphous material, which is represented by $E_a$. Such microcrystallization is believed to occur by change in a melting state of the film which causes change in a nucleation mechanism during recrystallization from heterogeneous nucleation where a substrate-film interface is a nucleation site, to a homogeneous nucleation.

This change in a nucleation mechanism depends on an maximum temperature and a cooling rate for the film. Thus, the microcrystallization threshold $E_a$ may vary depending on a variety of factors such as a film thickness, a film structure, the wavelength of a pulse laser beam and a pulse width. For example, when the thickness of amorphous silicon is 750 Å, $E_a$ is about 460 mJ/cm$^2$.

A microcrystallization energy $E_p$ for a polycrystalline semiconductor film from an amorphous semiconductor film refers to an energy capable of microcrystallizing a polycrystalline semiconductor film obtained by irradiating a laser on an amorphous semiconductor film.

Embodiment 1

The first embodiment of this invention will be described with reference to FIGS. 1 and 2. A laser irradiation process in this embodiment is an example of a laser irradiation process converting an amorphous silicon film to a polycrystalline silicon film. A pulse laser beam is irradiated on the same position multiple times, and an energy profile along one direction in a pulse laser beam irradiation region meets the following conditions (A) and (B):

(A) there are the first region having an energy density of $E_a$ or higher and the second regions on both sides of the first region having an energy density of less than $E_a$, where $E_a$ is a microcrystallization energy for the amorphous silicon; and (B) an energy density slope has an absolute value of 20 to 300 J/cm$^3$ in a boundary region in the second region extending to 1 μm from the boundary line between the first and the second regions.

Figure 1:
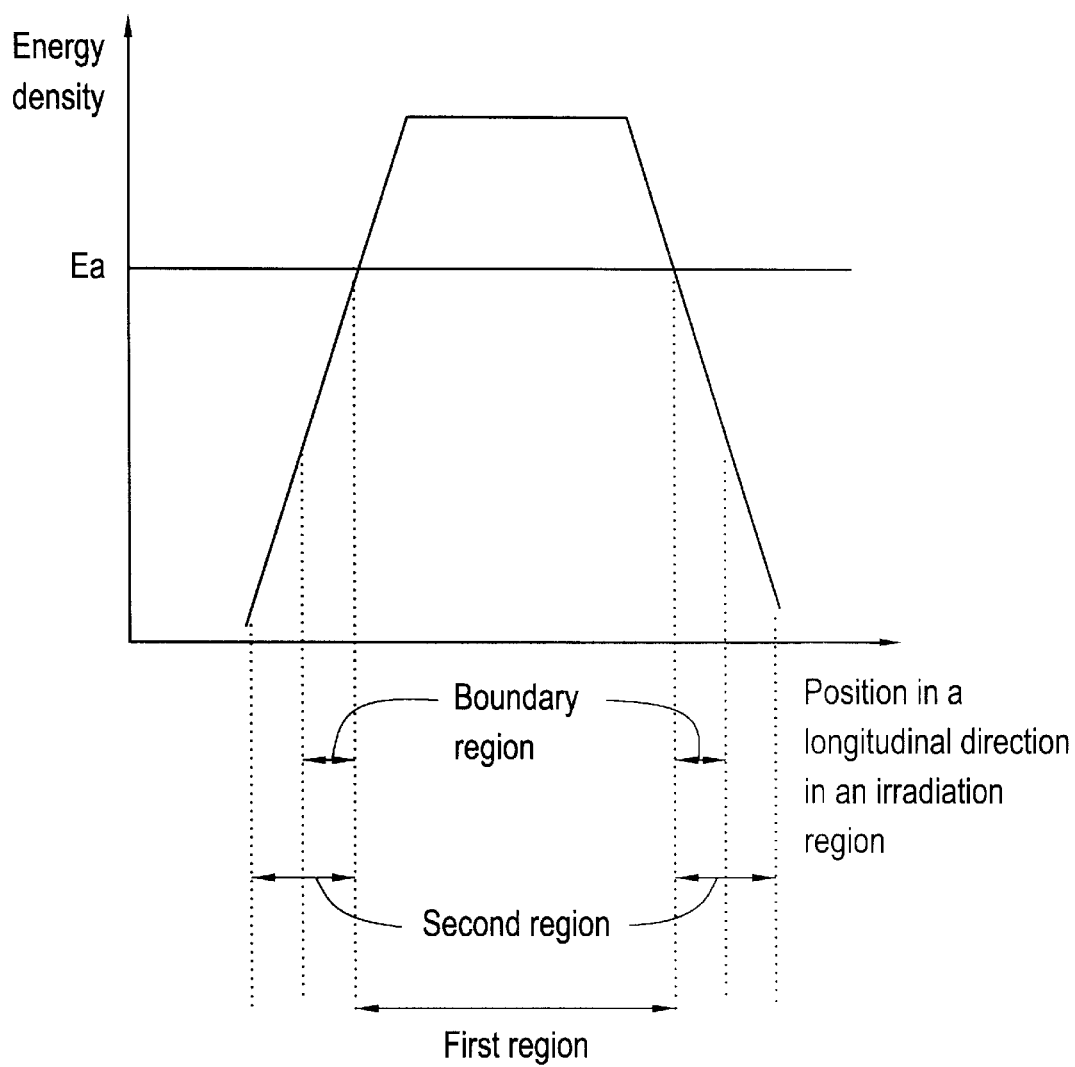
FIG. 1 shows a beam profile for a pulse laser beam in a laser irradiation process of this invention.

FIG. 1 shows an energy profile in a longitudinal direction in the pulse laser beam irradiation region, where an abscissa and an ordinate are a position and an energy density distribution in a longitudinal direction in the pulse laser beam irradiation region, respectively. The maximum energy density in this profile exceeds the microcrystallization threshold $E_a$ for the amorphous silicon.

The profile shown in FIG. 1 has the first region where an energy density is $E_a$ or higher, in its center section and the second regions in the vicinity of the first region where an energy density is less than $E_a$. A "boundary region" herein refers to a region in a second region extending to 1 μm from the boundary line between the first and the second regions. The width of the first region is preferably at least 1 μm. If less than 1 μm, it is sometimes difficult to satisfactorily provide a polycrystalline semiconductor structure having a grain size of about 1 μm.

A process for forming a polycrystalline semiconductor film will be described, which comprises irradiating a laser beam with the above profile on the same position multiple times.

Figure 2:
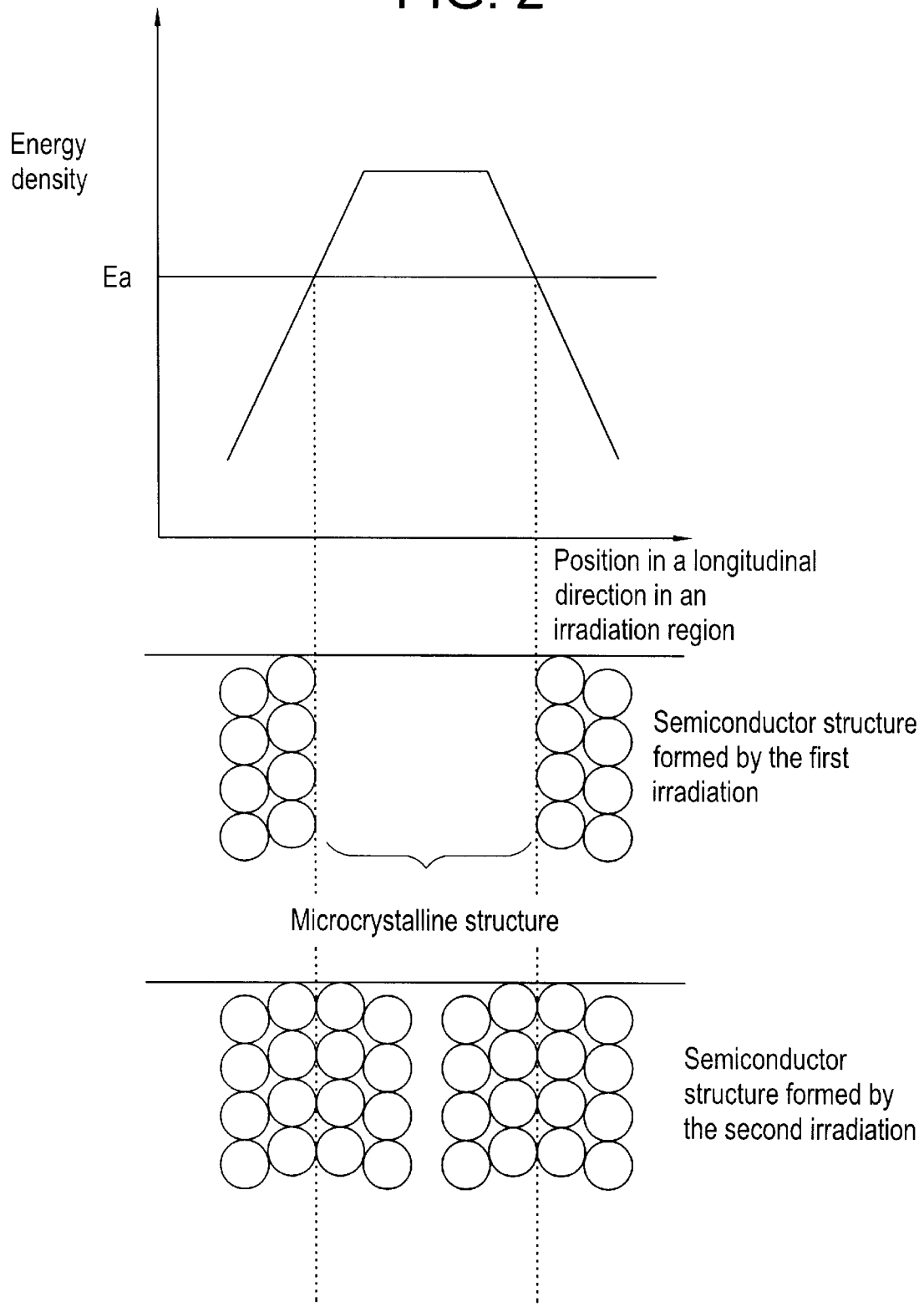
FIG. 2 illustrates a laser irradiation process of this invention.

The first irradiation of a laser beam having the above profile on a non-single crystal semiconductor film forms a polycrystalline structure about 1 μm of grain size and a microcrystalline structure below 20 nm of grain size around the boundary line where an energy density is $E_a$ (FIG. 2, center section). In the side regions near the boundary line where an energy density is less than $E_a$, the energy level is slightly lower than $E_a$. The regions, therefore, have an energy density suitable for forming large size grains as shown in FIG. 10. Thus, large grains about 1 μm of size are formed in these regions.

On the other hand, the region where an energy density is $E_a$ or higher has an energy density higher than a microcrystallization energy for an amorphous material, so that a microcrystalline structure of crystals whose grain size is below 20 nm.

Around the boundary line where an energy density is $E_a$, large grains about 1 μm of size are orderly arranged along the boundary line, and further large grains are formed outside of the region (FIG. 2, center section), where large grains are orderly arranged in 2 or 3 lines; in particular, the large size grains in the first line formed along the boundary line are favorably arranged.

A pulse laser beam having the above energy profile is again irradiated, so that the microcrystalline structure formed after the first irradiation is converted into a polycrystalline semiconductor structure in which a grain size is about 1 μm. In the laser irradiation process of this embodiment, a pulse laser beam is irradiated on the same position multiple times, so that a laser beam having an energy density of $E_a$ or higher is again irradiated on a microcrystallized region after the first irradiation. Since the laser beam having an energy density of $E_a$ or higher increases the grain size in the microcrystalline semiconductor structure, the microcrystalline structure after the first irradiation is converted into a polycrystalline semiconductor structure in which a grain size is about 1 μm. Thus, around the boundary line where an energy density is $E_a$, additional large grains about 1 μm of size are orderly arranged in the vicinity of the polycrystalline semiconductor structure (FIG. 2, lower part), where large grains are orderly arranged in 2 or 3 lines; in particular, the large size grains in the first line formed along the boundary line are favorably arranged.

As described above, irradiating a laser beam twice can form several lines of large grains about 1 μm of size which are orderly arranged.

In this invention, an energy density slope has an absolute value of 20 to 300 J/cm$^3$, preferably 30 to 100 J/cm$^3$ in the boundary region. If the absolute value of the energy density slope is too small, large size grains formed are randomly arranged and generally their sizes are widely distributed. Thus, when the region is used as, for example, a channel layer for a TFT, TFT properties such as a mobility may significantly vary. On the other hand, if the absolute value of the energy density slope is too large, an energy density in the boundary region may be decreased too much to provide a satisfactory polycrystalline structure.

Embodiment 2

This embodiment is an example of a laser irradiation process converting an amorphous silicon film to a polycrystalline silicon film by irradiating a pulse laser beam twice on the same point. An energy profile along one direction in a pulse laser beam irradiation region meets the following conditions (A) and (B):

(A) there are alternately the first regions having an energy density of $E_a$ or higher and the second regions having an energy density of less than $E_a$, where $E_a$ is a microcrystallization energy for the amorphous semiconductor film; and (B) an energy density slope has an absolute value of 20 to 300 J/cm$^3$ in a boundary region in the second region extending to 1 μm from the boundary line between the first and the second regions.

Figure 3:
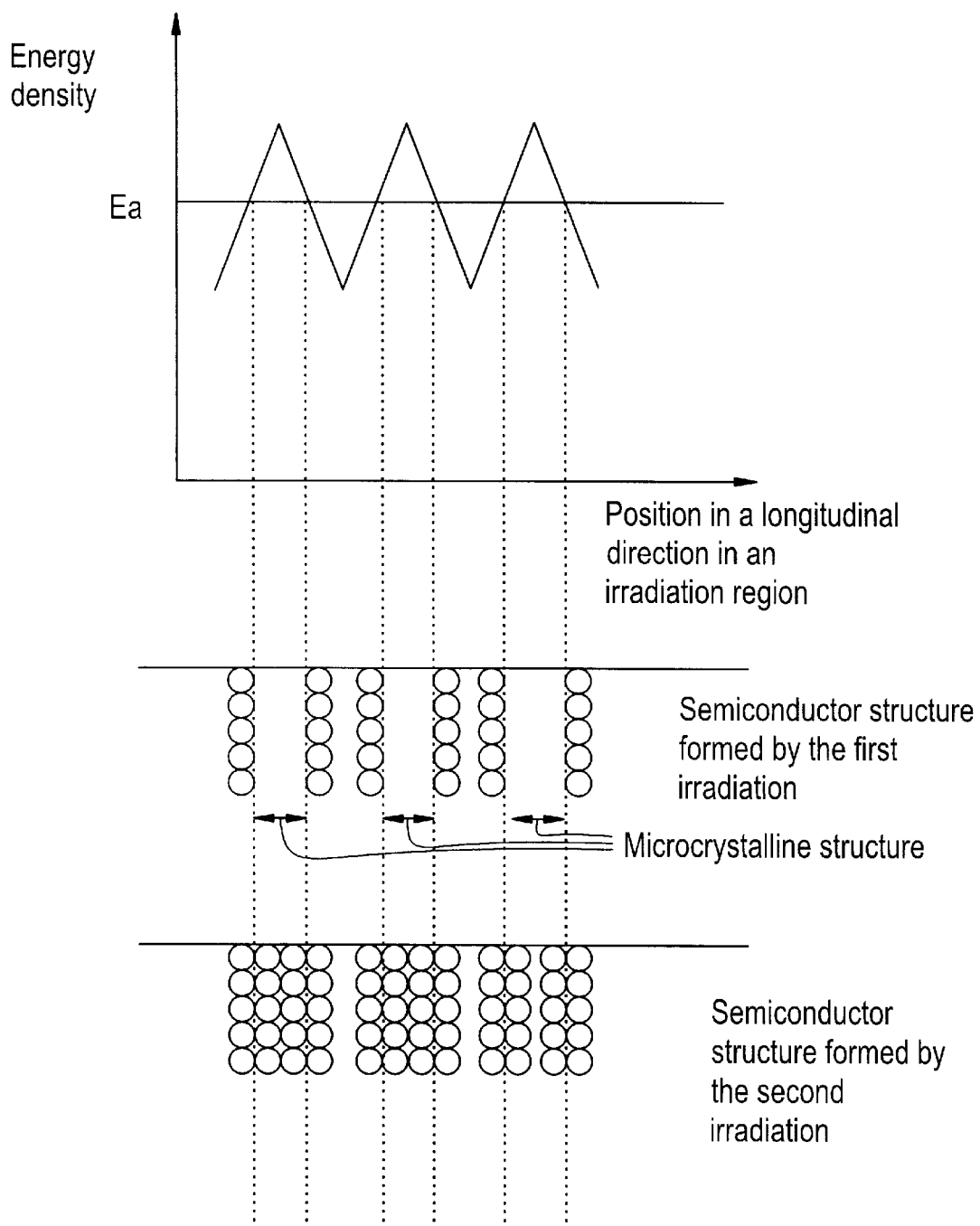
FIG. 3 illustrates a laser irradiation process of his invention.

FIG. 3 shows an energy profile in a longitudinal direction in the pulse laser beam irradiation region, where an abscissa and an ordinate are a position and an energy density distribution in a longitudinal direction in the pulse laser beam irradiation region, respectively. In this figure, there are alternately the first regions having an energy density of $E_a$ or higher and the second regions having an energy density of less than $E_a$.

A laser beam having such a profile may be used to form a plurality of polycrystalline semiconductor structure in which a grain size is about 1 μm in one step. For example, when the process is applied to a channel layer for a TFT device, crystalline semiconductor structures may be formed at areas to be device regions, to improve a process efficiency.

The width of the first region is preferably at least 1 μm. If it is less than 1 μm, it is sometimes difficult to satisfactorily provide a polycrystalline semiconductor structure in which a grain size is about 1 μm. When the width of the first region is less than 4 μm, large grains may be formed all over the part irradiated by the first region as shown in FIG. 3 (the lowest part), to provide a large area of polycrystalline semiconductor structure. Since orderly arranged large grains are formed by laser irradiation in about 2 lines from the boundary line between the first and the second regions, a gap may be generated when the first region has a width larger than 4 μm. When the width of the first region is less than 2 μm, large grains may be formed in more orderly arranged manner all over the part irradiated by the first region because large grains formed in the first line from the boundary line between the first and the second region are arranged more favorably than those in the second line.

When the width of the second region is less than 4 μm, a polycrystalline semiconductor structure formed by the first region is combined with a polycrystalline semiconductor structure formed by the second region, to form a continuous polycrystalline semiconductor structure (in FIG. 3, the width of the second region is larger than 4 μm. There are, therefore, parts without arranged large grains in the second regions). Since orderly arranged large grains are formed by laser irradiation in about 2 lines from the boundary line between the first and the second regions, a gap may be generated when the second region has a width larger than 4 μm. When the width of the second region is less than 2 μm, large grains may be formed in more orderly arranged manner all over the part irradiated by the second region because large grains formed in the first line from the boundary line between the first and the second region are arranged more favorably than those in the second line.

Forming a large area of polycrystalline structure all over the surface is advantageous for fabricating a refined device. A polycrystalline structure may be, however, disposed according to a layout for a device to be fabricated by subsequent processes. Thus, it is not always necessary to form a polycrystalline structure all over the surface.

Embodiment 3

This embodiment is an example of a laser irradiation process for converting an amorphous semiconductor film into a polycrystalline semiconductor film, where the maximum energy density in the first region exceeds the microcrystallization energy $E_p$ for the polycrystalline semiconductor film from the above amorphous semiconductor film. A "microcrystallization energy $E_p$ for a polycrystalline semiconductor film from an amorphous semiconductor film" refers to an energy capable of microcrystallizing a polycrystalline semiconductor film obtained by irradiating a laser on an amorphous semiconductor film.

Figure 4:
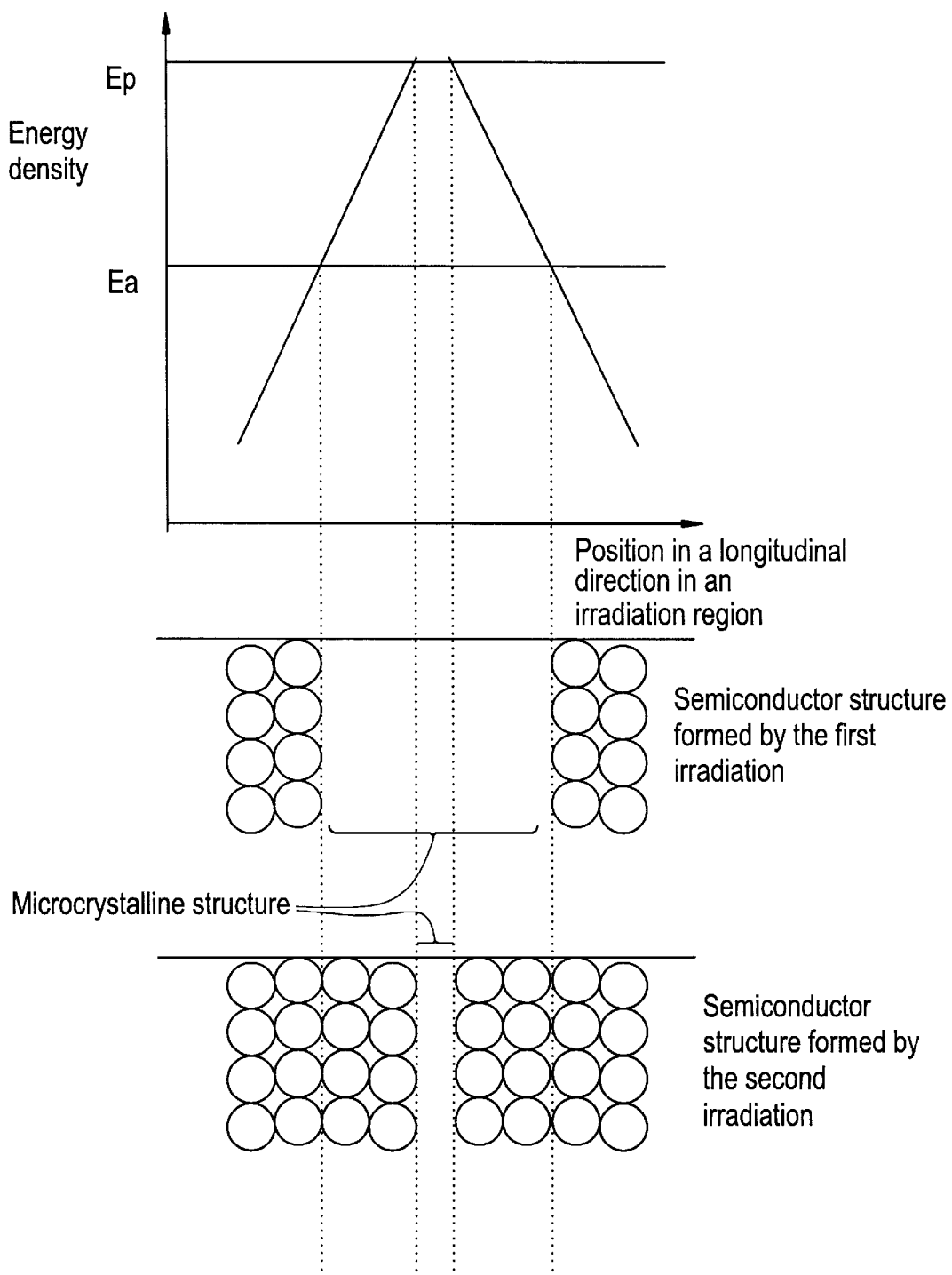
FIG. 4 illustrates a laser irradiation process of his invention.

FIG. 4 shows an energy profile in a longitudinal direction of a pulse laser beam irradiation region in this embodiment where an abscissa and an ordinate are a position and an energy density in the longitudinal direction of the pulse laser beam irradiation region, respectively. There are alternately the first regions having an energy density of $E_a$ or higher and the second regions having an energy density of less than $E_a$. The maximum energy density in the first region exceeds the microcrystallization energy $E_p$ for the polycrystalline silicon.

Irradiating twice a laser beam having the above profile on a non-single crystal semiconductor film can form several lines of polycrystalline semiconductor structures in which grains having a size of about 1 μm are orderly arranged, in the vicinity of the boundary line (FIG. 4, the lower part), as in Embodiment 1 except a microcrystalline structure is formed in the center of the first region.

The first irradiation microcrystallizes amorphous silicon in the region where an energy density exceeds $E_p$. The second irradiation of a laser beam having an energy density of $E_p$ or higher does not increase a grain size and thus the shape of the microcrystals is retained.

Consequently, as shown in the lower part of FIG. 4, a polycrystalline semiconductor structure with a grain size of about 1 μm is formed in the vicinity of a microcrystallized structure, and a distinct boundary line is formed between these structures.

The microcrystallized structure has a flat surface less irregular than the polycrystalline semiconductor structure. The process of this embodiment can, therefore, improve surface flatness in parts except a polycrystalline semiconductor structure which is used for, e.g., a channel layer in a device. It may be, for example, useful for providing a less stepped multilayer wiring structure.

Embodiment 4

This embodiment is an example of a laser irradiation process converting an amorphous silicon film to a polycrystalline silicon film where energy profiles along both longitudinal and transverse directions in a pulse laser beam irradiation region meet the following conditions (A) and (B):

(A) there are alternately the first regions having an energy density of $E_a$ or higher and the second regions having an energy density of less than $E_a$, where $E_a$ is a microcrystallization energy for the amorphous material; and (B) an energy density slope has an absolute value of 20 to 300 J/cm³ in a boundary region in the second region extending to 1 μm from the boundary line between the first and the second regions.

Figure 5:
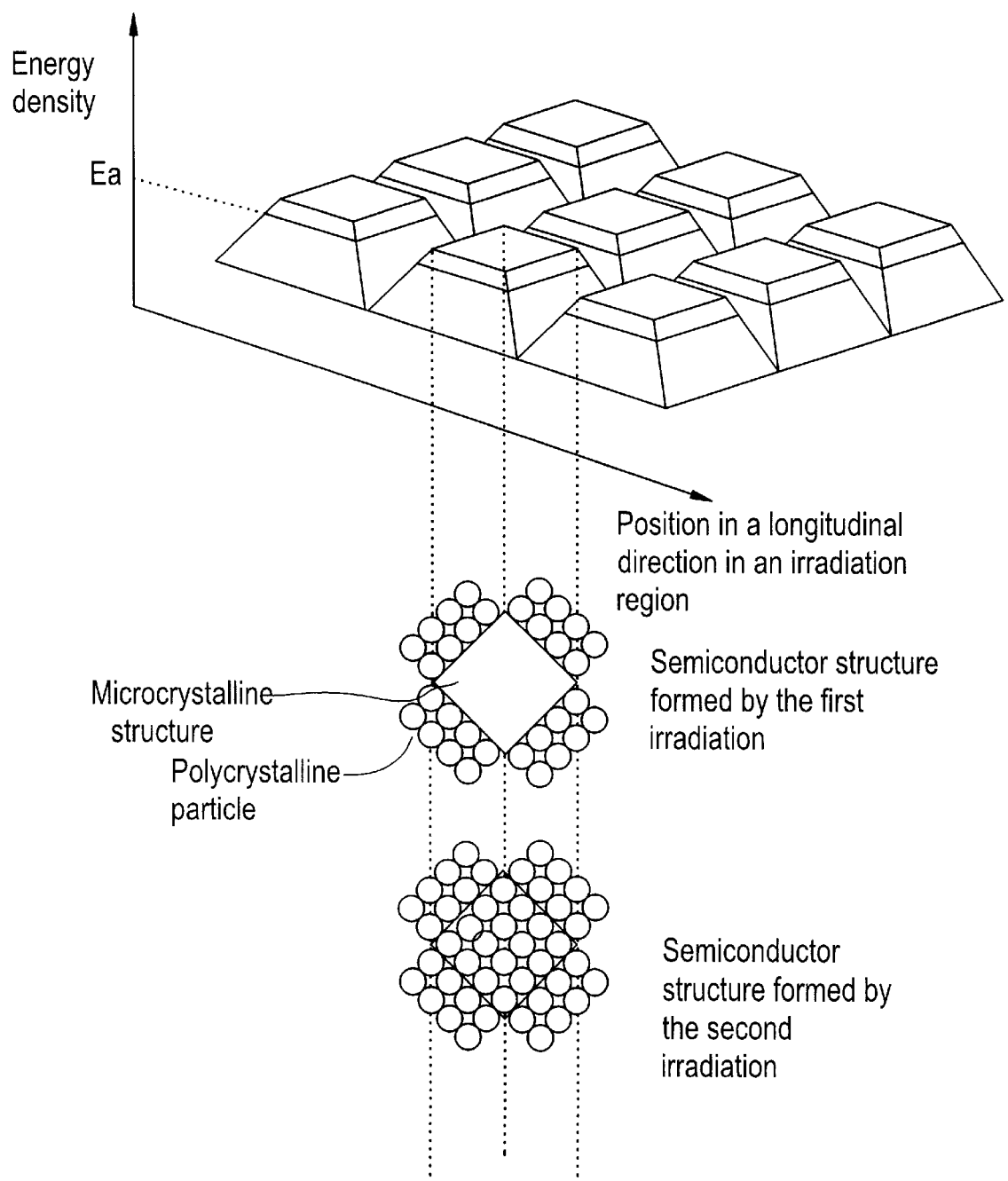
FIG. 5 illustrates a laser irradiation process of this invention.

FIG. 5 shows an energy profile in the pulse laser beam irradiation region, where an ordinate is an energy density. In this profile, there are alternately the first regions having an energy density of $E_a$ or higher and the second regions having an energy density of less than $E_a$ along both longitudinal and transverse directions in the beam irradiation region. This figure schematically shows a semiconductor structure formed by the first or second irradiation, where the inside of a lozenge corresponds to the first region with an energy density of $E_a$ or higher while the outside of a lozenge corresponds to the second region with an energy density of less than $E_a$.

A laser beam having such a profile may be used to arrang a polycrystalline semiconductor structure in which a grain size is about 1 μm, in both longitudinal and transverse directions in a pulse laser beam irradiation region, to provide a polycrystalline semiconductor film more suitable as, e.g., a channel layer in a device. For example, the film can be used as a channel layer in a TFT to provide a polycrystalline semiconductor film with less varied TFT properties such as a mobility.

In this embodiment, the width of the first region should be at least 1 μm in either longitudinal or transverse direction in a beam irradiation region. If it is less than 1 μm, it is difficult to provide a polycrystalline semiconductor structure in which a grain size is about 1 μm.

When the width of the first region is less than 4 μm in either longitudinal or transverse direction in a beam irradiation region, large grains which are two-dimensionally arranged in an orderly manner may be formed all over the part irradiated by the first region as shown in FIG. 5 (the lowest part) because orderly arranged large grains are formed by laser irradiation in about 2 lines from the boundary line between the first and the second regions. When the width of the first region is less than 2 μm, large grains may be formed in more orderly arranged manner all over the part irradiated by the first region because large grains formed in the first line from the boundary line between the first and the second region are arranged more favorably than those in the second line.

When the width of the second region is less than 4 μm, a polycrystalline semiconductor structure formed by the first region is combined with a polycrystalline semiconductor structure formed by the second region, to form a continuous polycrystalline semiconductor structure. It may allow a polycrystalline semiconductor film to be formed all over the surface. A width less than 4 μm is selected because orderly arranged large grains are formed by laser irradiation in about 2 lines from the boundary line between the first and the second regions. When the width of the second region is less than 2 μm, large grains may be formed in more orderly arranged manner all over the part irradiated by the second region because large grains formed in the first line from the boundary line between the first and the second region are arranged more favorably than those in the second line.

Embodiment 5

Figure 7A:
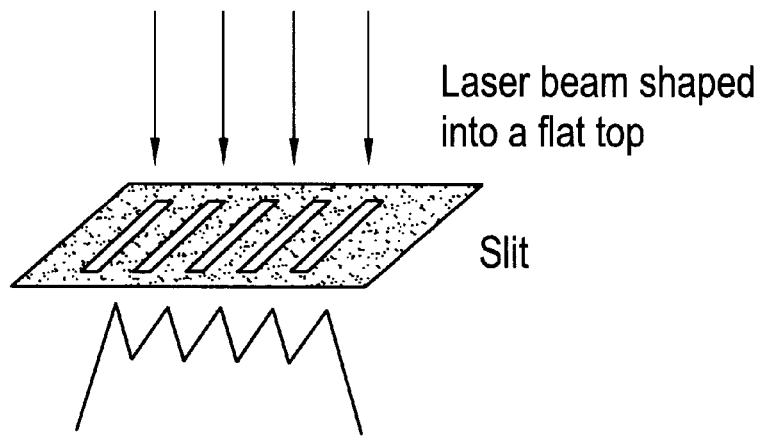

A beam profile in this invention may be obtained by a process illustrated in FIG. 7. FIG. 7(a) shows a process for forming a beam profile using a slit. In the process, a laser shaped into a flat top such as a trapezoid may be passed through a slit in which windows are aligned in a given interval, to form a desired beam profile. A slit material may be a metal material such as chromium, aluminum and stainless alloy. An energy density slope may be controlled by utilizing beam diffraction while adjusting an optical system. A dielectric mask may be used in place of a metal slit.

Figure 7B:

FIG. 7(b) shows a process for forming a beam profile using an antireflection film. An antireflection film whose light transmittance is adjusted is patterned on an amorphous silicon. Since a laser beam transmittance is different between masked and non-masked regions, there may be formed a beam profile in which a beam intensity periodically varies along a given direction. An antireflection film is oblique-etched to provide a tapered side. Thus, irradiating a laser shaped into a flat top from above may form a beam profile comprising a part having an energy density gradient. The slope of the part having an energy density gradient may be controlled by adjusting conditions for oblique-etching of the antireflection film and the layered structure of the antireflection film. It may be also controlled by using two or more dielectric having a different reflectance.

EXAMPLE

Example 1

The first example of this invention will be described. An amorphous silicon film was formed as follows.

A glass substrate was an OA-2 substrate (Nippon Denki Glass). On the substrate was deposited a silicon dioxide film as a base insulating film 100 nm of thickness by a plasma CVD using $SiH_4$ and $N_2O$, on which was then deposited an amorphous silicon film 75 nm of thickness by a low pressure CVD using $Si_2H_6$ under the conditions that a flow rate of $Si_2H_6$ was 150 sccm, a pressure was 8 Pa, a substrate temperature was 450° C. and a deposition duration was 70 min.

As a preliminary experiment for determining a profile, an $E_p$ was observed when a pulse laser beam with a wavelength of 308 nm and a pulse width of 50 nm was irradiated on the amorphous silicon film. FIG. 11 shows dependency of an average grain size in a polycrystal structure on an energy density when one pulse laser beam was irradiated on the amorphous silicon film or a polycrystalline silicon film with an average grain size of 18 nm. For the amorphous silicon film, an average grain size varied as indicated by black circles in the figure and $E_a$ was 460 mJ/cm². For the polycrystalline silicon film with an average grain size of 18 nm formed by irradiation with an energy density of 340 mJ/cm², an average grain size varied as indicated by white squares in the figure and $E_p$ was 520 mJ/cm².

From these results, a beam profile having a shape as shown in FIG. 1 was chosen in this example, and the maximum energy density, the width of the first region with an energy density of $E_a$ or higher and the energy density slope at the $E_a$ point were set to 495 mJ/cm², 4 μm and 35 J/cm³, respectively.

A pulse laser beam having the above profile was used to form a polycrystalline silicon film. FIG. 6 schematically shows a laser irradiation apparatus used in this example, in which a laser beam emitted from a pulse laser source 1 is passed through an optical system 2 and a slit 7 and then irradiated on a substrate 5 held on a stage 4. A film formed by irradiating twice the pulse laser beam having the above profile was observed with a scanning electron microscope (SEM). It was then found that there was formed a large-grain homogeneous structure in which about four lines of large grains with a size of about 1 μm are arranged in a width of about 4 μm.

On the other hand, as a control experiment, a laser irradiation was conducted with an energy density slope of 10 J/cm³ at the $E_a$ point while setting the maximum energy density and the width of the first region having an energy density of $E_a$ or higher as described above. A structure formed around the $E_a$ point contained large grains with a size of about 1 μm, which were, however, randomly arranged in a width of about 15 μm. This region has a grain-size distribution of about 0.02 to 1 μm, indicating an inhomogeneous structure.

Example 2

The second example of this invention will be described. A glass substrate was an OA-2 substrate (Nippon Denki Glass). On the substrate was deposited a silicon dioxide film as a base insulating film 100 nm of thickness by a plasma CVD using $SiH_4$ and $N_2O$.

On the substrate was then deposited an amorphous silicon film 50 nm of thickness by a low pressure CVD using $Si_2H_6$ under the conditions that a flow rate of $Si_2H_6$ was 150 sccm, a pressure was 8 Pa, a substrate temperature was 450° C. and a deposition duration was 46 min.

A preliminary experiment indicated that when the film thickness was 50 nm, $E_a$ and $E_p$ for a pulse laser beam with a wavelength of 308 nm and a pulse width of 50 nm were 420 and 470 mJ/cm², respectively.

In the light of the results, a beam profile having a shape as shown in FIG. 3 was chosen in this example, and the maximum energy density, the width of the first region with an energy density of $E_a$ or higher, the width of the second region with an energy density of less than $E_a$ and the energy density slope at the $E_a$ point were set to 460 mJ/cm$^2$, 2 μm, 3 μm and 40 J/cm$^3$, respectively.

A pulse laser beam having the above profile was irradiated on the same position twice, so that there could be formed a plurality of large-grain homogeneous structures in which four lines of large grains with a size of about 1 μm were arranged in a width of about 4 μm.

Example 3

The third example of this invention will be described. In this example, energy profiles in both longitudinal and transverse directions in a beam irradiation region met given conditions.

A glass substrate was a 1737 substrate (Corning). On the substrate was deposited a silicon dioxide film as a base insulating film 100 nm of thickness by a plasma CVD using SiH$_4$ and N$_2$O.

On the substrate was then deposited an amorphous silicon film 75 nm of thickness by a plasma CVD using SiH$_4$ and H$_2$ under the conditions that a flow rate of SiH$_4$ was 150 sccm, a flow rate of H$_2$ was 400 sccm, a pressure was 100 Pa, a discharge power was 0.1 W/cm$^2$, a substrate temperature was 320° C. and a deposition duration was 8 min. After deposition, the product was subject to dehydro-annealing at 400° C. for 2 hours. When using a pulse laser beam with a wavelength of 248 nm and a pulse width of 35 nm, $E_a$ and $E_p$ for the amorphous silicon film were 480 and 550 mJ/cm$^2$, respectively.

In the light of the results, a beam profile shown in the upper part of FIG. 5 was chosen in this example, where an irradiation region is rectangular whose longitudinal and transverse profiles are the same; the maximum energy density, the width of the first region with an energy density of $E_a$ or higher, the width of the second region with an energy density of less than $E_a$ and the energy density slope at the point where an energy density was $E_a$ were set to 520 mJ/cm$^2$, 4 μm, 4 μm and 40 J/cm$^3$, respectively.

A pulse laser beam having the above profile was irradiated on the same position twice, so that there could be formed a large-grain homogeneous structure in which eight lines of large grains with a size of about 1 μm were arranged in a width of about 8 μm along both longitudinal and transverse directions. The two lines of large grains sandwiching the interface between the first and the second regions represented by a lozenge in this figure exhibited particularly excellent arrangement and grain-size distribution.

What is claimed is:

1. A laser irradiation process comprising irradiating a pulse laser beam on a non-single crystal semiconductor film to form a polycrystalline semiconductor film, where an energy profile along one direction in a pulse laser beam irradiation region meets the conditions (A) and (B) and comprising irradiating the pulse laser beam on the same position multiple times:
    (A) there are a first region having an energy density of $E_a$ or higher and second regions on both sides of the first region having an energy density of less than $E_a$, where $E_a$ is a microcrystallization energy for an amorphous semiconductor film; and
    (B) an energy density slope has an absolute value of 20 to 300 J/cm$^3$ in a boundary region in the second region extending to 1 μm from the boundary line between the first and the second regions.

2. A laser irradiation process as claimed in claim 1, where an energy profile in a direction perpendicular to the above direction meets the following conditions (A) and (B):
    (A) there are the first region having an energy density of $E_a$ or higher and the second regions on both sides of the first region having an energy density of less than $E_a$, where $E_a$ is a microcrystallization energy for an amorphous semiconductor film; and
    (B) an energy density slope has an absolute value of 20 to 300 J/cm$^3$ in a boundary region in the second region extending to 1 μm from the boundary line between the first and the second regions.

3. A laser irradiation process as claimed in claim 1, where an energy profile in a direction perpendicular to the above direction meets the following conditions (A) and (B):
    (A) there are alternately the first regions having an energy density of $E_a$ or higher and the second regions having an energy density of less than $E_a$, where $E_a$ is a microcrystallization energy for an amorphous semiconductor film; and
    (B) an energy density slope has an absolute value of 20 to 300 J/cm$^3$ in a boundary region in the second region extending to 1 μm from the boundary line between the first and the second regions.

4. A laser irradiation process as claimed in claim 1, where the energy density slope has an absolute value of 30 to 100 J/cm$^3$ in the boundary region.

5. A laser irradiation process as claimed in claim 1, where the width of the first region is at least 1 μm.

6. A laser irradiation process as claimed in claim 1, where the width of the first region is below 4 μm.

7. A laser irradiation process as claimed in claim 1, where the width of the second region is below 4 μm.

8. A laser irradiation process as claimed in claim 1, where the maximum energy density in the first region exceeds the microcrystallization energy $E_p$ for the polycrystalline semiconductor film from the amorphous semiconductor film.

9. A laser irradiation process comprising irradiating a pulse laser beam on a non-single crystal semiconductor film to form a polycrystalline semiconductor film, where an energy profile along one direction in a pulse laser beam irradiation region meets the conditions (A) and (B) and comprising irradiating the pulse laser beam on the same position multiple times:
    (A) there are alternately first regions having an energy density of $E_a$ or higher and second regions having an energy density of less than $E_a$, where $E_a$ is a microcrystallization energy for an amorphous semiconductor film; and
    (B) an energy density slope has an absolute value of 20 to 300 J/cm$^3$ in a boundary region in the second region extending to 1 μm from the boundary line between the first and the second regions.

10. A laser irradiation process as claimed in claim 9, where an energy profile in a direction perpendicular to the above direction meets the following conditions (A) and (B):
    (A) there are the first region having an energy density of $E_a$ or higher and the second regions on both sides of the first region having an energy density of less than $E_a$, where $E_a$ is a microcrystallization energy for an amorphous semiconductor film; and
    (B) an energy density slope has an absolute value of 20 to 300 J/cm$^3$ in a boundary region in the second region extending to 1 μm from the boundary line between the first and the second regions.

11. A laser irradiation process as claimed in claim 2, where an energy profile in a direction perpendicular to the above direction meets the following conditions (A) and (B):

(A) there are alternately the first regions having an energy density of $E_a$ or higher and the second regions having an energy density of less than $E_a$, where $E_a$ is a microcrystallization energy for an amorphous semiconductor film; and (B) an energy density slope has an absolute value of 20 to 300 J/cm$^3$ in a boundary region in the second region extending to 1 μm from the boundary line between the first and the second regions.

12. A laser irradiation process as claimed in claim 9, where the energy density slope has an absolute value of 30 to 100 J/cm$^3$ in the boundary region.

13. A laser irradiation process as claimed in claim 9, where the width of the first region is at least 1 μm.

14. A laser irradiation process as claimed in claim 9, where the width of the first region is below 4 μm.

15. A laser irradiation process as claimed in claim 9, where the width of the second region is below 4 μm.

16. A laser irradiation process as claimed in claim 9, where the maximum energy density in the first region exceeds the microcrystallization energy $E_p$ for the polycrystalline semiconductor film from the amorphous semiconductor film.

* * * * *